Aug. 18, 1959 V. E. BOTTOM 2,900,584

TRANSISTOR METHOD AND PRODUCT

Filed June 16, 1954 3 Sheets-Sheet 1

INVENTOR.
VIRGIL E. BOTTOM
BY
Mueller & Aichele
Atty's.

TRANSISTOR METHOD AND PRODUCT

Filed June 16, 1954 3 Sheets-Sheet 2

INVENTOR.
VIRGIL E. BOTTOM
BY Mueller & Aichele
Attys.

Aug. 18, 1959 V. E. BOTTOM 2,900,584

TRANSISTOR METHOD AND PRODUCT

Filed June 16, 1954 3 Sheets-Sheet 3

INVENTOR.
VIRGIL E. BOTTOM
BY
Mueller & Aichele
Atty's.

United States Patent Office
2,900,584
Patented Aug. 18, 1959

2,900,584

TRANSISTOR METHOD AND PRODUCT

Virgil E. Bottom, Phoenix, Ariz., assignor to Motorola, Inc., Chicago, Ill., a corporation of Illinois Application June 16, 1954, Serial No. 437,091
7 Claims. (Cl. 317—235)

The present invention relates to transistor processes and products, and more particularly to an improved process for fabricating a transistor of the type referred to in the art as the "alloyed-junction" transistor.

Transistors are generally three electrode semiconductor devices which include a block of semiconductive material such as germanium or silicon. The three main electrodes for a transistor are the emitter, collector and base electrodes, Most present-day transistors are of two types, the point-contact type and the junction type. Point-contact transistors have a base electrode in large area, low resistance contact with a block of semiconductive material, and have emitter and collector electrodes in rectifying contact with the block of semiconductive material. The semiconductive material may be of the n-type having an excess of electrons or may be of the p-type having an excess of "holes." Junction transistors have a single crystal with one type of material in the center and the other type on both sides. The junction transistor may be of the p-n-p type or of the n-p-n type. The base electrode is connected to the central material and the emitter and collector electrodes are connected to the end materials, respectively. A more recent junction transistor is the "alloy-junction" type.

Alloyed-junction transistors include a semiconductor crystal wafer composed, for example, of germanium, and having a metal impurity alloyed into each of its opposite sides to form respective p-n junctions within the crystal. For example, an n-type germanium wafer may be used with a p-type metal impurity alloyed to its opposite faces. The p-type metal impurity can be any of the metals of column 3 in the periodic table. However, indium is preferred of these elements since it will alloy with germanium at relatively low temperatures so that defects that may act as traps are not formed and the tendency for the conversion of the germanium wafer from n-type to p-type does not occur. Furthermore, when indium solidifies, no appreciable stress is set up in the crystal wafer which could cause it to crack or be strained. The alloy-fusion technique has also been applied to p-type semiconductor crystal wafers with n-type metal impurities (such as binary tin-antimony alloy) being alloyed in the opposite faces of the wafer. For reasons of clarity, the transistor and process of the present invention will be described as an n-type germanium wafer having indium fused to the opposite sides thereof. However, it is to be understood that the crystal wafer may be composed of other semiconductor materials, such as silicon; and also that the crystal may be of the p-type and may have other metal impurities fused to the opposite surfaces thereof.

The alloying of the impurity metal to the semiconductor wafer is usually carried out in an inert atmosphere furnace (such as argon) in which discs or pellets of indium, for example, are fused to opposite faces of an n-type semiconductor wafer composed, for example, of germanium. The temperature of the furnace is then raised above the melting point of the indium to fuse and alloy the indium with the germanium and form the respective p-n junctions within the crystal wafer. During the alloying process, the fused metal dissolves the surface of the semiconductor wafer forming cavities, and this continues until the liquid metal becomes saturated with the semiconductor at the alloying temperature. During the cooling of the assembly the semiconductor contained in the liquid metal is precipitated in the semiconductor wafer carrying with it some alloying metal. This causes the formation of p-type areas within the n-type crystal and resulting p-n junctions.

It is an object of the present invention to provide an improved transistor of the alloyed-junction type, that may be manufactured expeditiously and which exhibits superior characteristics as compared with prior devices of this type.

It is another object of the present invention to provide an improved and simplified process for fabricating such an alloyed-junction transistor.

A feature of the invention is the provision of an improved process for the fabrication of alloyed-junction transistors, in which the metal bodies to be fused to the opposite faces of the semiconductor wafer are formed in an improved and simplified manner by extrusion, punching, melting and etching.

Another feature of the invention is the provision of such an improved process in which such metal bodies are fused to the opposite faces of the semiconductor simultaneously instead of successively so as to simplify the manufacture and improve the characteristics of the resulting product.

Yet another feature of the invention is the provision of such an improved process in which the base assembly of the transistor is connected to the semiconductor after the electrodes have been formed thereon, with the base assembly serving to support the semiconductor while the connections thereto are being made.

A further feature of the invention is the provision of a transistor having a base electrode in the form of a clip that serves to support the semiconductor during fabrication of the transistor and which provides a large-area low-resistance contact with the semiconductor.

Yet another feature of the invention is the provision of an improved process for fabricating alloyed-junction transistors in which the covers are attached to the base assemblies in an improved manner by heat conducting jigs, so that heat generated during this step is conducted away and does not raise the temperature of the interior of the casing to a point that could damage the transistor assembly.

The above and other features of the invention which are believed to be new are set forth with particularity in the appended claims. The invention itself, however, together with further objects and advantages thereof may best be understood by reference to the following description when taken in conjunction with the accompanying drawings in which:

The process of the present invention for fabricating an alloyed-junction transistor comprises, forming a member of semiconnductor material having a pair of opposite faces, positioning a pair of bodies of a metal impurity on the opposite faces of the member, heating the member and the bodies to fuse and alloy the bodies simultaneously to the opposite faces of the member, etching the surface of the semiconductor member to remove short-circuiting deposits between the fused metal bodies, forming a base assembly for the transistor comprising an insulating member with three rigid leads extending therethrough in spaced and insulated relation one from the other, affixing to one of the leads a U-shaped metallic clip having a length corresponding to the width of the wafer, placing the wafer in the clip to be supported thereby with one end of the wafer extending into the clip, affixing the clip to the end of the wafer to establish electrical contact therebetween, and establishing respective electrical connections from the fused metal bodies to the other ones of the rigid leads.

Figures 1, 2, 3, 5, 6, 7:
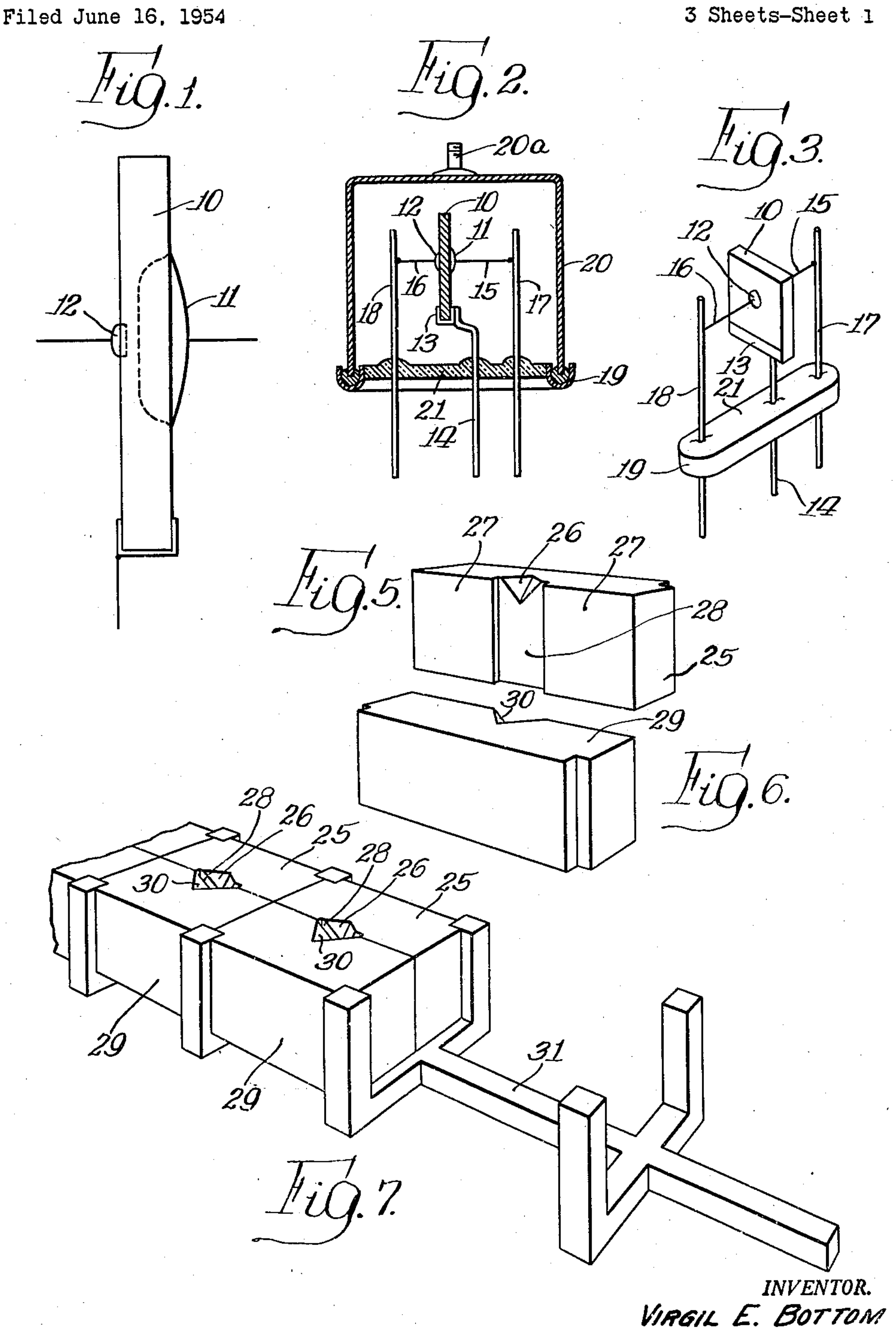
Fig. 1 is a schematic representation of an alloyed-junction transistor.
Fig. 2 is a sectional view of such a transistor fabricated in accordance with the improved process of the present invention.
Fig. 3 is a perspective view of the transistor with the cover or casing removed.
Figs. 5–7 are various views of a suitable jig utilized in carrying out a step in the process.

The transistor assembly of Fig. 1 includes a semiconductor crystal wafer 10 which, as previously mentioned, may be composed of n-type germanium. The wafer 10 has an indium body 11 fused to one side thereof in a manner to be described, and the area of the wafer adjacent the indium body is alloyed with the indium to form a p-type portion with a resulting p-n junction between that portion and the n-type semiconductor material in the wafer. A second indium body 12 is fused to the opposite side of wafer 10 directly opposite and coaxial with body 11. The latter body, likewise, has an alloyed p-type area adjacent its inner surface which also forms a p-n junction with the n-type semiconductor material in wafer 10. Body 11 forms the collector electrode and body 12 forms the emitter electrode. The collector electrode preferably is somewhat larger than the emitter.

In the representations of Figs. 2 and 3 the semiconductor wafer 10 is supported in a metallic clip 13 at one end, the clip forming the base electrode and being soldered to the crystal and welded or otherwise affixed to a rigid electrically conductive base lead 14. The collector and emitter electrodes 11, 12 have respective wires 15, 16 soldered thereto, with the wires being soldered to respective rigid electrically conductive collector and emitter leads 17, 18. The leads 14, 17 and 18 are supported in a base 21 of ceramic, glass or other insulating material and extend therethrough, as illustrated. Base 21 has a metallic ring 19 extending around the periphery thereof and affixed thereto, ring 19 being composed of "Kovar" or other solderable metal that can be fused to ceramic or glass. The assembly is enclosed in a cover or can 20, with the lower rim of the can being soldered to ring 19.

Figure 4:
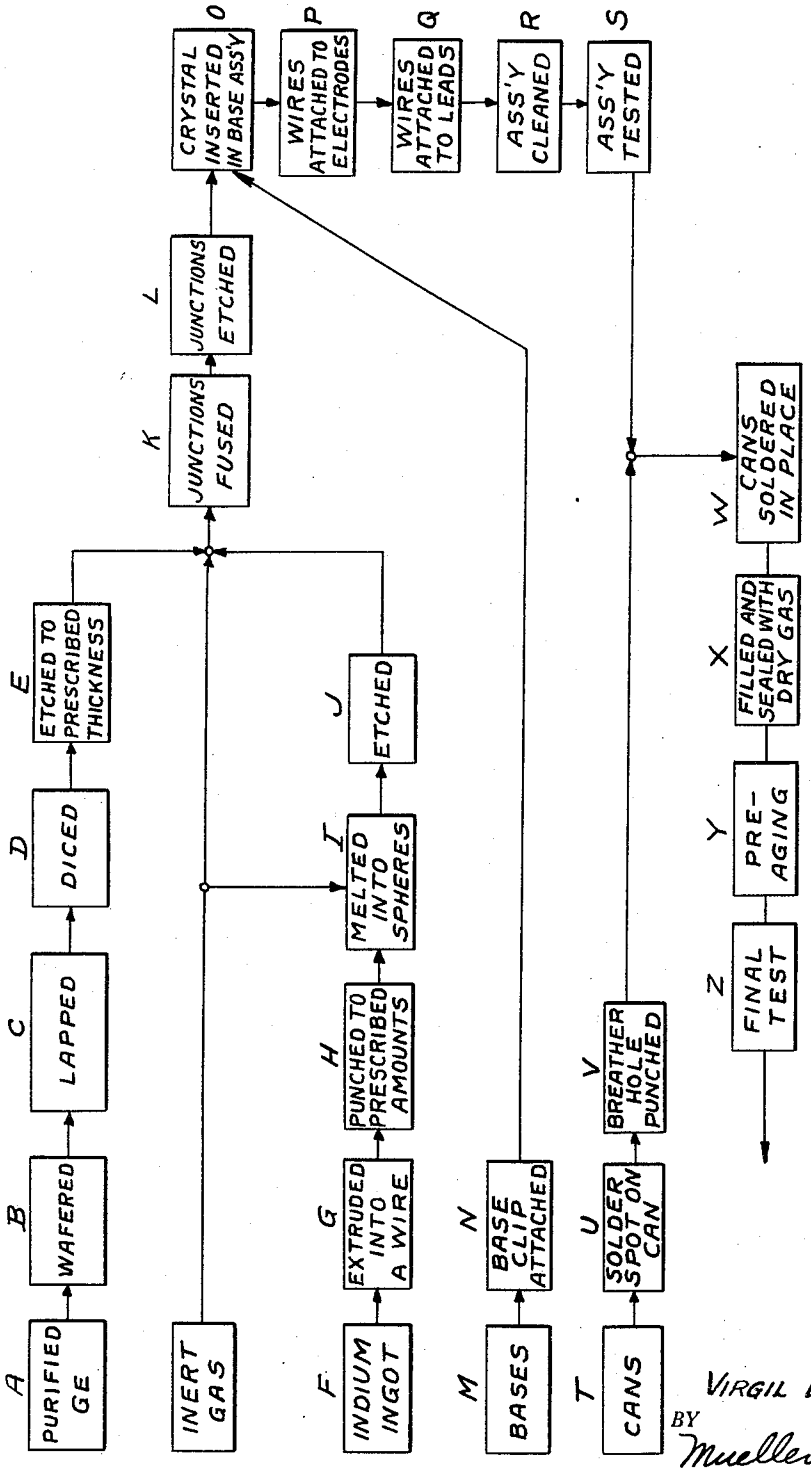
Fig. 4 is a schematic representation of the various steps involved in the fabrication of fused-junction transistors in accordance with the process of the present invention.

The transistor assembly shown in Figs. 1–3 is constructed in accordance with the present invention by the process indicated schematically in Fig. 4. The preparation of the semiconductor germanium wafer is indicated by steps A—E of that process. In accordance with these steps, a crystal of purified germanium is provided. It is desirable that this crystal have a relatively low resistivity of the order of .2–5.0 ohm centimeters. The crystal is cut into relatively large wafers by means at a thin diamond or silica wheel. Each of these wafers is then lapped in known manner. The usual lapping process consists of lapping a wafer in a machine comprising two flat annular plates between which the wafer is moved by a somewhat thinner carrier. An abrasive mixture is fed through the upper plate into the lapping surface. This lapping is continued until the wafer has a thickness of about .015". The large wafer is then diced into smaller wafers with each of the smaller wafers comprising the semiconductor crystal for the individual transistor units. These latter wafers have a size of the order of .014" x .065" x .120". The dicing is accomplished by means of a multiple gang saw consisting of 0.007" silicon carbide plates driven at high speed. Individual wafers are then etched to a thickness of about .007"±.0001". A typical etching solution has the following composition:

| | Cc. |
|---|---|
| 70% nitric acid | 5 |
| 52% hydrofluoric acid | 5 |
| Distilled water | 1 |

It is desirable that the crystal wafers be oriented and cut so that their faces are parallel to the Miller Indices crystallographic planes (111) to assist in the formation of flat bottomed cavities and planar junctions therein for improved performance of the final transistor and lower losses. This technique is disclosed and claimed in copending application Serial No. 409,339, filed February 10, 1954, in the name of William E. Taylor and assigned to the present assignee.

The formation of the indium bodies that are to be fused to the opposite surfaces of each of the semiconductor wafers is illustrated by steps F—J of Fig. 4. In accordance with the present process, these spheres are conveniently formed by providing an indium ingot, and extruding the ingot into a wire having a diameter of, for example, 0.20". The wire is then clipped to provide pellets containing the desired amount of indium, and these pellets are melted into spheres. These spheres are then etched to clean the spheres. The following etching solution is satisfactory for this purpose:

| | Cc. |
|---|---|
| 70% nitric acid | 10 |
| 52% hydrofluoric acid | 10 |
| Distilled water | 10 |

The indium pellets are formed into spheres in the above described manner in order that the contact point of the indium bodies with the germanium wafer can be accurately established for precise positioning of the resulting electrodes in the final transistor unit.

The next step in the process comprises, fusing an indium sphere to each side of the semiconductor germanium wafer. This step is indicated at K of Fig. 4 and is accomplished by use of a supporting structure shown in Figs. 5–7. In accordance with prior art practice, the germanium wafer is placed horizontally in a cavity in a graphite jig, and an indium disc is placed in the jig over the wafer. The assembly is fired and the indium melts and starts to alloy with the germanium. Upon cooling the indium is bonded to the germanium. The assembly is then removed from the jig and replaced therein upside down. A second indium disc is placed in the jig against the opposite face of the wafer and the second disc is fired and bonded to the opposite surface of the wafer. The temperature is then raised to obtain the desired alloying and fusing of the indium with the germanium wafer. This method is somewhat cumbersome in that it entails considerable manipulation of the germanium wafer, the indium pellets, and the locating jigs. Moreover, it requires separate and distinct operations for firing each indium disc on the opposite sides of the germanium wafer. This method of individually fusing the indium discs on the opposite sides of the germanium wafer not only complicates the manufacturing process, but also causes the first junction to be remelted during the second firing step which gives rise to the possibility of excessive undesired diffusion of the first junction. In the present process, both electrodes are fired and fused to the opposite sides of the germanium crystal simultaneously; this may be achieved by use of the supporting structure shown in Figs. 5–7.

The assembly jig shown in Figs. 5–7 includes a first block 25 (Fig. 5) composed of high heat resistant material such as graphite. Block 25 has a notch 26 formed in one edge thereof, and the notch has a V-shaped configuration and a bottom slanting towards the inner face 27 of the block. This notch has dimensions corresponding to the indium spheres discussed previously herein. A rectangular slot 28 is formed across the inner face 27 of block 25 adjacent notch 26, and this slot has a width corresponding to the width of the semiconductor wafer formed in step E of Fig. 4.

The jig also includes a second block 29 (Fig. 6) of high heat resistant material such as graphite. Block 29 has a notch 30 formed in one edge thereof, and notch 30 has the same configuration as notch 26.

A series of blocks 25, 26 are supported in a holder 31 (Fig. 7), and this holder supports the blocks adjacent one another with notches 26 and 30 precisely aligned in mating relation. The semiconductor wafers are supported between the blocks, and the indium spheres are inserted in the notches. In this manner, the spheres are accurately located by the notches to be directly opposite one another adjacent opposite surfaces of each of the semiconductor wafers. The holder 31 may then be passed through a heat zone such as an argon atmosphere furnace. This causes the spheres to melt and alloy and fuse with the opposite surfaces of the wafer, and this produces the p-n junctions within the crystal in the manner previously discussed herein. The disclosed assembly jig allows any desired number of assemblies to be treated for the simultaneous fusion of the indium spheres to opposite sides of the semiconductor wafer.

It can be seen that the entire fusion process of the semiconductor wafer and metal spheres can be accomplished without any intermediate manipulation of the materials. The wafers and spheres are loaded into the structure and, after the structure has made a trip through the heat zone and the alloying and fusing has taken place, it is only a matter of several seconds to unload the various assemblies.

After the fusing of the indium spheres in accordance with step K, it is necessary to etch the assembly so that it will exhibit transistor characteristics, and this is shown in step L. This etching removes a surface layer on each side of the semiconductor wafer to expose the intersection of the respective p-n junction surfaces with the surfaces of the wafer. The following etching solution may be used:

| | Cc. |
|---|---|
| 70% nitric acid | 10 |
| 52% hydrofluoric acid | 10 |
| Distilled water | 10 |

The unit is etched in this solution at around 70° F. for about 30 seconds, and is then washed in hot water and dried by warm air. The etching assures that there is no short-circuiting of the emitter and collector electrodes due to a conductive surface layer. The subsequent cleaning is merely to remove acid residues and the byproducts of the chemical etching solution.

The above etching step is known to the art, but it is usual practice to subject the assembly to this step after the base electrode has been applied. This necessitates great care in preventing the etching solution from coming in contact with the base tab since otherwise the unit will not exhibit the desired high back resistance. However, in accordance with the present process and in a convenient manner now to be described, the base tab is affixed at a latter stage in the process.

Figures 8, 9, 10, 11, 12:
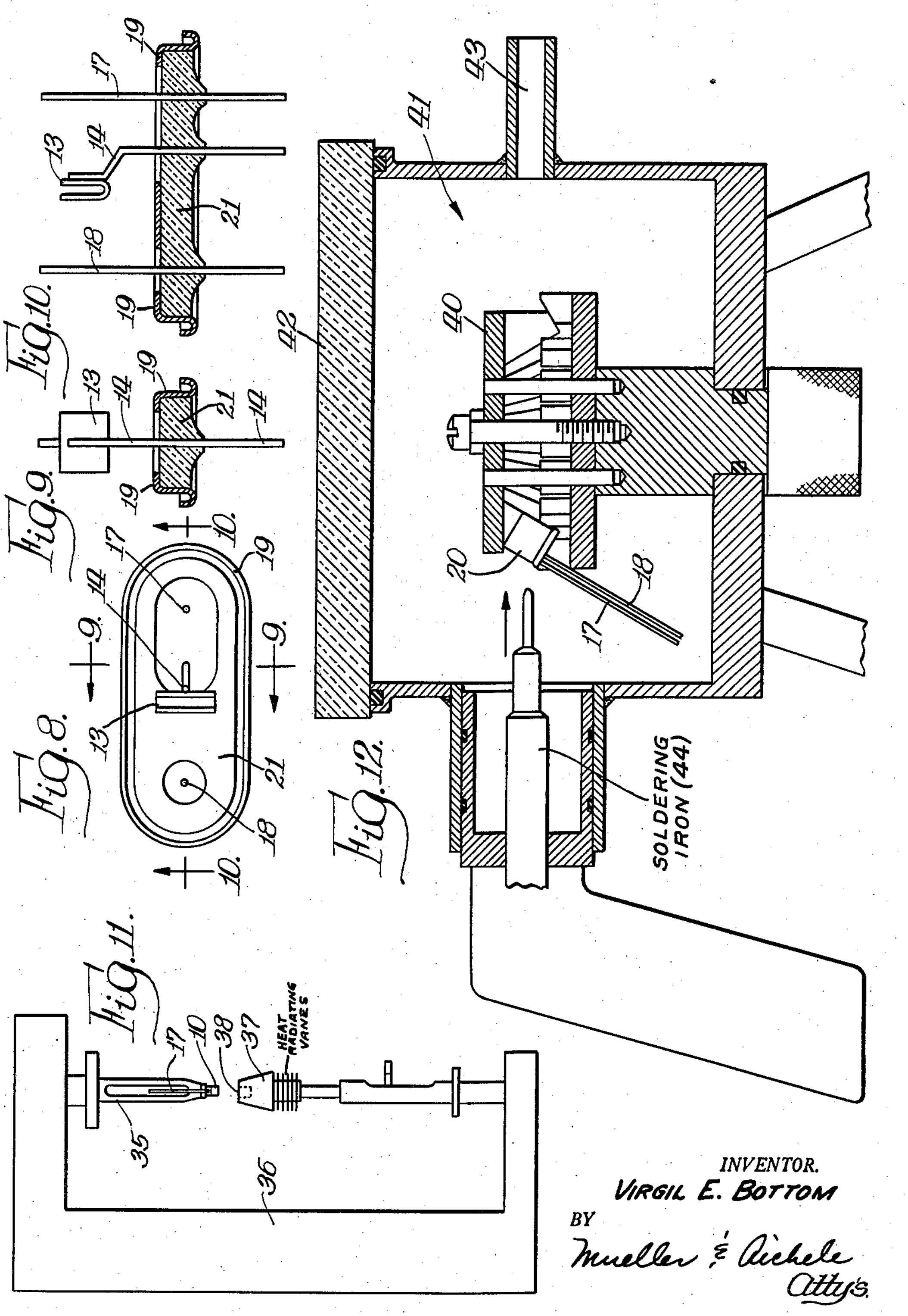
Figs. 8–10 are various views of the base assembly of the transistor.
Fig. 11 shows a simple mechanism for carrying out another step in the process.
Fig. 12 shows a mechanism for carrying out yet another step in the process.

The formation of the base assembly of the improved transistor of the present invention is indicated by steps M and N of Fig. 4, and the base assembly itself is illustrated in Figs. 2, 3 and in Figs. 8–10. As shown in these figures, and as briefly described previously herein, the base assembly comprises a block 21 of ceramic or other insulating material through which the various leads 14, 17 and 18 extend, with these leads being rigidly supported in the block. The block is surrounded by a metallic ring

19 of a metal or alloy that may be fused to glass or ceramic, such as "Kovar," and this ring has a U-shaped peripheral portion for receiving the lower edge of the metal cover or can 20 of the unit and in which the can is soldered in a manner to be described. When so desired, other known means can be used for affixing the cover to the base. The base electrode is in the form of a U-shaped clip 13, and this clip is welded to the base lead 14 during the fabrication of the base assembly.

The alloyed-junction crystal wafer assembly is then mounted on the base assembly as shown in step O of Fig. 4. This is accomplished by the simple expedient of dropping the germanium wafer into clip 13 by a pair of tweezers, with the clip holding the assembly while it is soldered to the end of the crystal wafer to form the base electrode. This construction not only provides a convenient means for holding the assembly during this soldering operation, but also provides a large area base connection to the wafer which provides a desirable low base resistance. This convenient technique provides a distinct advantage over the prior practice of soldering one end of a nickel tab to the end of one side of the germanium, which requires careful handling and jigging and also results in an assembly with relatively high base resistance.

The next steps in the process are shown as P and Q in Fig. 4, and these steps comprise soldering the wires 15 and 16 (Figs. 2 and 3) to the respective collector and emitter electrodes, and to their corresponding leads 17, 18. Wires 15, 16 are preferably formed of tinned Phosphor bronze with a diameter of the order of .002", and the soldering and welding operations may be performed by any known techniques such as by resistance or hot air soldering.

The assembly is then cleaned as indicated in step R, and this cleaning is usually effected by spraying the assembly with distilled water. This cleaning step may also incorporate etching for superior results, and such etching may be carried out in accordance with the teachings of copending application Serial No. 455,575 filed September 13, 1954 in the name of Ackerman, and assigned to the present assignee. Briefly, the etching process disclosed and claimed in that application makes use of an electrolytic etching process to remove all extraneous matter from the surface of the semiconductor wafer without affecting the other metallic parts of the assembly. The process consists of immersing the assembly in an alkaline solution with the fused indium electrodes being used as the anodic connection. A separate electrode forms the cathodic connection and a current is passed through the solution from the anodic and cathodic connections to etch the surface of the semiconductor. Full details of the process are disclosed in the Ackerman application.

The assembly is then given the preliminary test as shown in step S, and a low-frequency power-gain tester may be used at this point. This tester may be constructed and calibrated to read power gain directly, and if the transistor fails to deliver 40 db gain, it is rejected. The instrument may also have provisions for reading the current through both junctions of the semiconductor wafer when such junctions are biased in the reverse direction. And if either back current is more than 1 microampere at −25 or −6 volts, the unit is rejected. This preliminary test serves as a convenient means for sorting out defective transistors prior to the subsequent final operations which would be wasted as far as the defective units are concerned.

The casings or cans 20 that enclose the transistor assembly are provided at step T of Fig. 4. These casings each receive a spot of solder at a point on their surface at step U, and a pinhole is pierced through the solder spot at step V. The pinhole serves as a breather and allows the air to escape from the interior of the casing while it is being soldered to the base 21 of the transistor assembly.

The soldering operation of the cans to the base is shown in step W of Fig. 4, and a convenient mechanism for accomplishing this is shown in Fig. 11. To perform this step, a clamp 35 for holding the base assembly is provided with this clamp being supported in a bracket 36 and being rotatable about a vertical axis. A block 37 of substantial mass and composed of high heat conductivity metal such as aluminum, is also supported in bracket 36 and is rotatable around the same vertical axis as the clamp 35. The block has a cavity 38 formed in its upper surface which receives the can 20 and holds the can aligned with the base assembly. Clamp 35 and block 37 are movable with respect to one another along the axis of rotation so that the cover can be brought into contact with the channel formed by ring 19 for soldering thereto. The block serves to hold the can during the soldering operation, and also to conduct away heat developed during the operation. It is to be noted that during the soldering operation, the lower rim of can 20 is soldered to ring 19 in the manner shown in Fig. 2. The provision of the block 37 serves to hold the internal temperature of the transistor assembly below 100° C., and this is important since it has been found that heating of the assembly above this level impairs the electrical characteristics of the transistor.

The assembly is now subjected to step X in which it is filled with a dry inert gas such as helium and sealed. A mechanism for accomplishing this is shown in Fig. 12. Several transistor assemblies are mounted in a reel 40 inside a cylindrical chamber 41 with a glass top 42. The air is removed from the chamber through line 43 by a vacuum pump and helium or other suitable gas is introduced into the chamber through that line. The transistor cans fill with the gas through the breather holes formed in step V, the gas being at or near atmospheric pressure. The reel is then turned to bring the solder spot surrounding the breather hole near to a soldering iron 44 which moves into position to melt the solder and close the breather hole.

The units are then removed and after a pre-aging step Y, pass to the final test Z. The purpose of the pre-aging step is to assure that the characteristics of the completed transistors will not suffer appreciable change after they have been in use for a period of time. This step usually consists in storing the units at 65° C. without power for a time interval of, for example, 24 hours. It may also include storing the units under power for similar lengths of time and under similar temperature conditions. The final test is made after the pre-aging and measurements are made of the current gain, base resistance and collector resistance, checks are made for power gain at various frequencies, noise tests are made, and other appropriate and usual measurements of the transistor characteristics are determined.

The power which a transistor can deliver to its load is usually limited by the rate at which the heat generated in the semiconductor can be dissipated from the unit. The power handling capabilities of the unit described herein can be increased, therefore, by increasing the heat dissipation and one convenient means for accomplishing this is as follows. The container 20 (Fig. 2), instead of being filled with an inert gas, is filled with a material capable of conducting heat to the walls of the container from the semiconductor 10. A suitable material for this purpose is a silicone oil such as presently being marketed under the trade designation "Dow Corning Fluid DC-200." The casing, in turn, is mounted on what is termed a "heat sink," such as the metal chassis of the apparatus in which it is incorporated, in heat conductivity relation with the heat sink. This mounting can be achieved by affixing a screw 20*a* to the container 20 by soldering or the like (Fig. 2), and this screw serves to mount the unit on the chassis and forms a heat-conducting path from the container to the chassis. The collector electrode 11 has a tendency to overheat as the power dissipation is increased, and this tendency is not completely obviated by the oil in the container. The rate of heat flow from the collector to the oil can be increased by replacing wire 15 with a ribbon of high heat conductivity such as silver.

Transistors manufactured in accordance with the process described herein, exhibit the following characteristics, and these characteristics are listed herein by way of example and as illustrative of the improved characteristics of the transistor.

| | |
|---|---|
| Collector voltage | 6.0 v. |
| Emitter current | 2.0 ma. |
| Collector resistance | 1.0 megohm. |
| Base resistance | 200 ohms. |
| Emitter resistance | 30 ohms. |
| Current amplification factor | (αCB) —25. |
| Power gain (20,000 ohm load) | 40 db. |
| Collector cut off current | 1 microamp. (—25 volts). |
| Noise factor (1000 c.p.s.) | 25 db. |
| Source impedance (grounded emitter) | 500 ohms. |
| Load impedance (grounded emitter) | 40,000 ohms. |

The improved process of the present invention provides, therefore, an improved method for manufacturing alloyed-junction transistors that lends itself ideally to mass production. In accordance with the process, each step flows conveniently to the next and unnecessary and cumbersome operations are eliminated.

Transistors constructed by the process have been found to exhibit superior electrical and mechanical characteristics as compared with known transistors of this general type.

While particular embodiments of the invention have been shown and described, modifications may be made, and it is intended in the appended claims to cover all such modifications as fall within the true spirit and scope of the invention.

I claim:

1. The process for fabricating an alloyed-junction transistor which comprises, forming a wafer of semiconductor material having a pair of opposite faces, positioning a pair of bodies of a metal impurity on said opposite faces of said wafer, heating said wafer and said bodies to fuse and alloy said bodies simultaneously to said opposite faces of said wafer, forming a base assembly comprising an insulating member with three leads extending therethrough and supported thereby in spaced and insulated relation one from the other, affixing to one of said leads a U-shaped metallic clip having a length corresponding to the width of said wafer, placing said wafer in said clip to be supported thereby with one end of said wafer extending into said clip, affixing said clip to said wafer to establish electrical contact therebetween, and establishing electrical connections from the fused bodies to respective ones of the others of said leads.

2. The process for fabricating an alloyed-junction transistor which comprises, forming a wafer of n-type germanium semiconductor material having a pair of opposite faces, positioning a pair of indium bodies on said opposite faces of said wafer, heating said wafer and said bodies to fuse and alloy said bodies simultaneously to said opposite faces of said wafer, forming a base assembly comprising an insulating member with three rigid leads extending therethrough in spaced and insulated relation one from the other, affixing to one of said rigid leads a U-shaped metallic clip having a length corresponding to the width of said wafer, placing said wafer in said clip to be supported thereby with one end of said wafer extending into said clip, soldering said clip to said end of said wafer to establish electrical contact therebetween, soldering a pair of wires to respective ones of the fused bodies, and affixing said wires respectively to the others of said leads.

3. A transistor unit including in combination, a wafer of semiconductor material having a pair of opposite faces, a pair of bodies of a metal impurity fused and alloyed on said opposite faces of said wafer, a base assembly comprising an insulating member with three leads extending therethrough and supported thereby in spaced and insulated relation from one another, a U-shaped metallic clip having a length corresponding to the width of said wafer affixed to one of said leads and supporting said wafer with one end of said wafer extending into said clip, said clip being affixed to said semiconductor wafer to establish electrical contact therewith, and means for establishing respective electrical connections from said fused bodies to the others of said leads.

4. A transistor unit including in combination, an n-type germanium wafer having a pair of opposite faces, a pair of indium bodies fused and alloyed on said opposite faces of said wafer, a base assembly comprising an insulating member with three rigid electrically conductive leads extending therethrough and supported thereby in spaced and insulated relation one from the other, a U-shaped metallic clip having a length corresponding to the width of said wafer affixed to one of said leads and supporting said wafer with one end of said wafer extending into said clip, said clip being soldered to said semiconductor to establish electrical contact therewith, and a pair of wires respectively connected to said fused bodies and to the other ones of said leads to establish respective electrical connections therebetween.

5. A transistor unit including in combination, a subassembly comprising a wafer of semiconductor material having a pair of opposite faces, a collector electrode and an emitter electrode on said opposite faces of said wafer, a mounting base assembly including a glass portion, metallic means on said glass portion to which to secure a metal cover and thereby effect a closure over and around the entire base assembly, a collector lead, an emitter lead, and a base lead extending through said glass portion and each lead supported therein in spaced apart and insulated relation from one another, a single metallic member electrically connected to and supporting said subassembly, said metallic member being at least as long as the horizontal dimension of said wafer in the subassembly so as to provide a large area base connection thereto, being electrically and mechanically connected to said base lead and extending horizontally relative to the top of said mounting base, and being connected to the base lead at a point spaced above said mounting base, said collector and emiter electrodes being in electrical connection with their respective leads and a metal cover secured to said metallic means and effecting a closure between the metallic means and the metal cover around the entire base assembly and over the subassembly.

6. A transistor unit including in combination, a subassembly comprising a wafer of semiconductor material having a pair of opposite faces, a collector electrode and an emitter electrode on said opposite faces of said wafer, a mounting base assembly including a glass portion, metallic means on said glass portion, said metallic means including a peripheral portion extending around the base assembly for receiving a metal cover to be secured thereto and cover the subassembly, a collector lead, an emitter lead, and a base lead extending through said glass portion and each lead supported therein in spaced apart and insulated relation to one another, a single metallic member electrically connected to and supporting said subassembly, said metallic member being at least as long as the horizontal dimension of said wafer in the subassembly so as to provide a large area base connection thereto, being electrically and mechanically connected to said base lead and extending horizontally relative to the top of said mounting base, and being connected to the base lead at a point spaced above said mounting base, said collector and emitter electrodes being in electrical connection with their respective leads, a metal cover secured to said metallic means in a liquid-tight connection, and a qauntity of oil within the cover and around the semiconductor subassembly for dissipation of heat away from the same.

7. A transistor including in combination, a wafer of semiconductor material having a pair of opposite faces, a collector electrode and an emitter electrode on said opposite faces of said wafer, a mounting base assembly having a glass portion, a metallic means around said glass portion to which to secure a metal cover for said transistor to close said transistor, a collector lead, an emitter lead, and a base lead each extending through said glass portion and each lead supported therein in spaced apart and insulated relation from one another, a single metallic member electrically connected to and supporting said wafer with said electrodes thereon, said single metallic member extending in a horizontal direction relative to the top of the mounting base assembly and being of a size so as to support said wafer over an area at least as great as the horizontal dimension of said wafer and providing a large area base connection to said wafer, with said single metallic member being electrically connected to said base lead, said collector and emitter electrodes being in electrical connection with their respective leads, and a metal cover for said transistor secured to said metallic means and effecting a closure therewith entirely around said transistor.

References Cited in the file of this patent

UNITED STATES PATENTS

| | | |
|---|---|---|
| 2,402,662 | Ohl | June 25, 1946 |
| 2,595,475 | McLaughlin | May 6, 1952 |
| 2,629,672 | Sparks | Feb. 24, 1953 |
| 2,635,199 | Wolfskill | Apr. 14, 1953 |
| 2,644,852 | Dunlap | July 7, 1953 |
| 2,651,009 | Meyer | Sept. 1, 1953 |
| 2,656,493 | Conant | Oct. 20, 1953 |
| 2,665,399 | Lingel | Jan. 5, 1954 |
| 2,705,767 | Hall | Apr. 5, 1955 |
| 2,731,704 | Spanos | Jan. 24, 1956 |
| 2,740,076 | Mathews et al. | Mar. 27, 1956 |
| 2,748,325 | Jenny | May 29, 1956 |
| 2,756,483 | Wood | July 31, 1956 |

FOREIGN PATENTS

| | | |
|---|---|---|
| 256,674 | Switzerland | Mar. 1, 1949 |
| 262,107 | Switzerland | Sept. 1, 1949 |